United States Patent
Tsai

(10) Patent No.: US 12,412,755 B2
(45) Date of Patent: *Sep. 9, 2025

(54) ETCHING SYSTEM FOR FABRICATING SEMICONDUCTOR DEVICE STRUCTURE

(71) Applicant: NANYA TECHNOLOGY CORPORATION, New Taipei (TW)

(72) Inventor: Tzu-Ching Tsai, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 629 days.

This patent is subject to a terminal disclaimer.

(21) Appl. No.: 17/848,513

(22) Filed: Jun. 24, 2022

(65) Prior Publication Data
US 2023/0420273 A1 Dec. 28, 2023

(51) Int. Cl.
*H01L 21/67* (2006.01)
*H01L 21/66* (2006.01)

(52) U.S. Cl.
CPC .. *H01L 21/67063* (2013.01); *H01L 21/67253* (2013.01); *H01L 22/12* (2013.01)

(58) Field of Classification Search
CPC ......... H01L 21/67063; H01L 21/67253; H01L 22/00; H01L 22/12; H01L 22/10; H01L 21/00; H01L 21/67
USPC ........................................................ 438/14
See application file for complete search history.

(56) References Cited

U.S. PATENT DOCUMENTS 9,349,662 B2   5/2016  Wu et al.
12,183,643 B2* 12/2024 Tsai .................. H01L 21/67253

2004/0060659 A1   4/2004  Morioka et al.
2007/0193687 A1   8/2007  Kagoshima
2009/0132078 A1   5/2009  Sakano
2022/0302143 A1   9/2022  Cheng

FOREIGN PATENT DOCUMENTS

TW          201721787 A      6/2017

OTHER PUBLICATIONS

Office Action and and the search report mailed on Oct. 24, 2024 related to U.S. Appl. No. 17/808,940.
Office Action and and the search report mailed on Dec. 20, 2024 related to U.S. Appl. No. 17/808,940.
Office Action dated on Jun. 26, 2023 related to Taiwanese Application No. 111140077.

(Continued)

*Primary Examiner* — Monica D Harrison
(74) *Attorney, Agent, or Firm* — Xuan Zhang

(57) ABSTRACT

The present application discloses an etching system. The etching system includes an etch module executing a first etching recipe on a first wafer to turn a first wafer state of the first wafer to a second wafer state; a first measurement module collecting the second wafer state of the first wafer to generate a first set of data; and an artificial intelligence module coupled to the first measurement module and the etch module, analyzing the first set of data and update the first etching recipe to a second etching recipe when the first set of data is not within a predetermined range. The artificial intelligence module is configured for generating the second etching recipe taking into consideration at least one of an etching rate of the second wafer, a rate of rotation of the second wafer, and a tilt angle of the second wafer.

12 Claims, 14 Drawing Sheets

(56) References Cited

OTHER PUBLICATIONS

Office Action dated on Sep. 11, 2023 related to Taiwanese Application No. 111140077.
Office Action and and the search report mailed on Mar. 12, 2025 related to U.S. Appl. No. 17/808,940.
Office Action and and the search report mailed on May 15, 2025 related to U.S. Appl. No. 17/808,940.

* cited by examiner

ETCHING SYSTEM FOR FABRICATING SEMICONDUCTOR DEVICE STRUCTURE

TECHNICAL FIELD

The present disclosure relates to an etching system for fabricating a semiconductor device structure, and more particularly, to an etching system for fabricating a semiconductor device structure by using an artificial intelligence module.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a fabrication system including an etch module configured to execute a first etching recipe on a first wafer to turn a first wafer state of the first wafer to a second wafer state; a first measurement module configured to collect the second wafer state of the first wafer to generate a first set of data; and an artificial intelligence module coupled to the first measurement module and the etch module, configured to analyze the first set of data and update the first etching recipe to a second etching recipe when the first set of data is not within a predetermined range. The second etching recipe is configured to be applied on a second wafer to be processed after the first wafer.

Another aspect of the present disclosure provides a fabrication system including a deposition module configured to execute a first deposition recipe on a first wafer to turn a first wafer state of the first wafer to a second wafer state; a first measurement module configured to collect the second wafer state of the first wafer to generate a first set of data; and an artificial intelligence module coupled to the first measurement module and the deposition module, configured to analyze the first set of data and update the first deposition recipe to a second deposition recipe when the first set of data is not within a predetermined range. The second deposition recipe is configured to be applied on a second wafer to be processed after the first wafer.

Another aspect of the present disclosure provides a fabrication system including an implantation module configured to execute a first implantation recipe on a first wafer to turn a first wafer state of the first wafer to a second wafer state; a first measurement module configured to collect the second wafer state of the first wafer to generate a first set of data; and an artificial intelligence module coupled to the first measurement module and the etch module, configured to analyze the first set of data and update the first implantation recipe to a second implantation recipe when the first set of data is not within a predetermined range. The second implantation recipe is configured to be applied on a second wafer to be processed after the first wafer.

Due to the design of the fabrication system of the present disclosure, the related process recipe may be updated (or adjusted) on a wafer-to-wafer time frame by employing the artificial intelligence module 300 and the feedback data measured by the first measurement module 210. As a result, the yield and/or reliability of the wafers may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
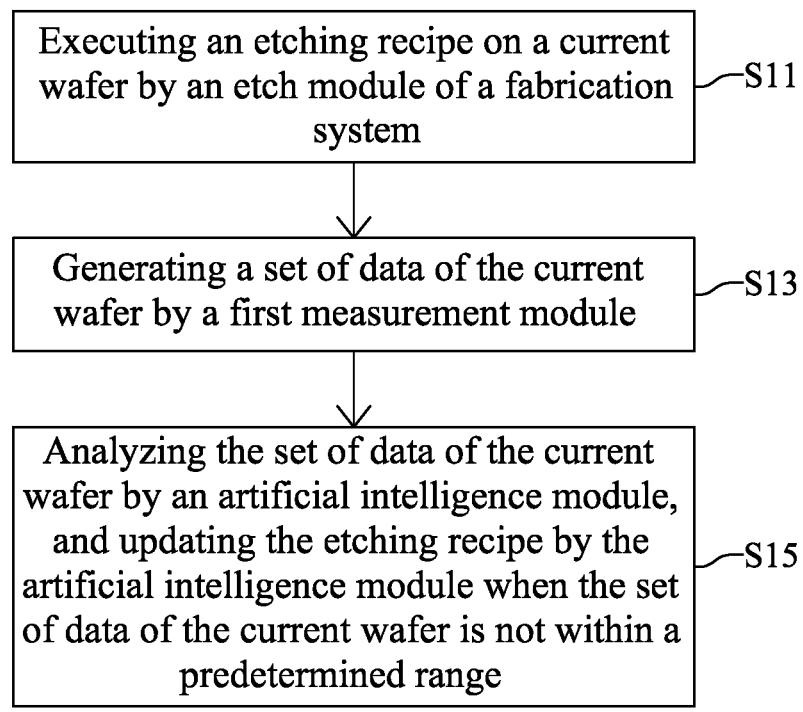
FIG. 1 illustrates, in a flowchart diagram form, a method for fabricating a semiconductor device employing a fabrication system in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
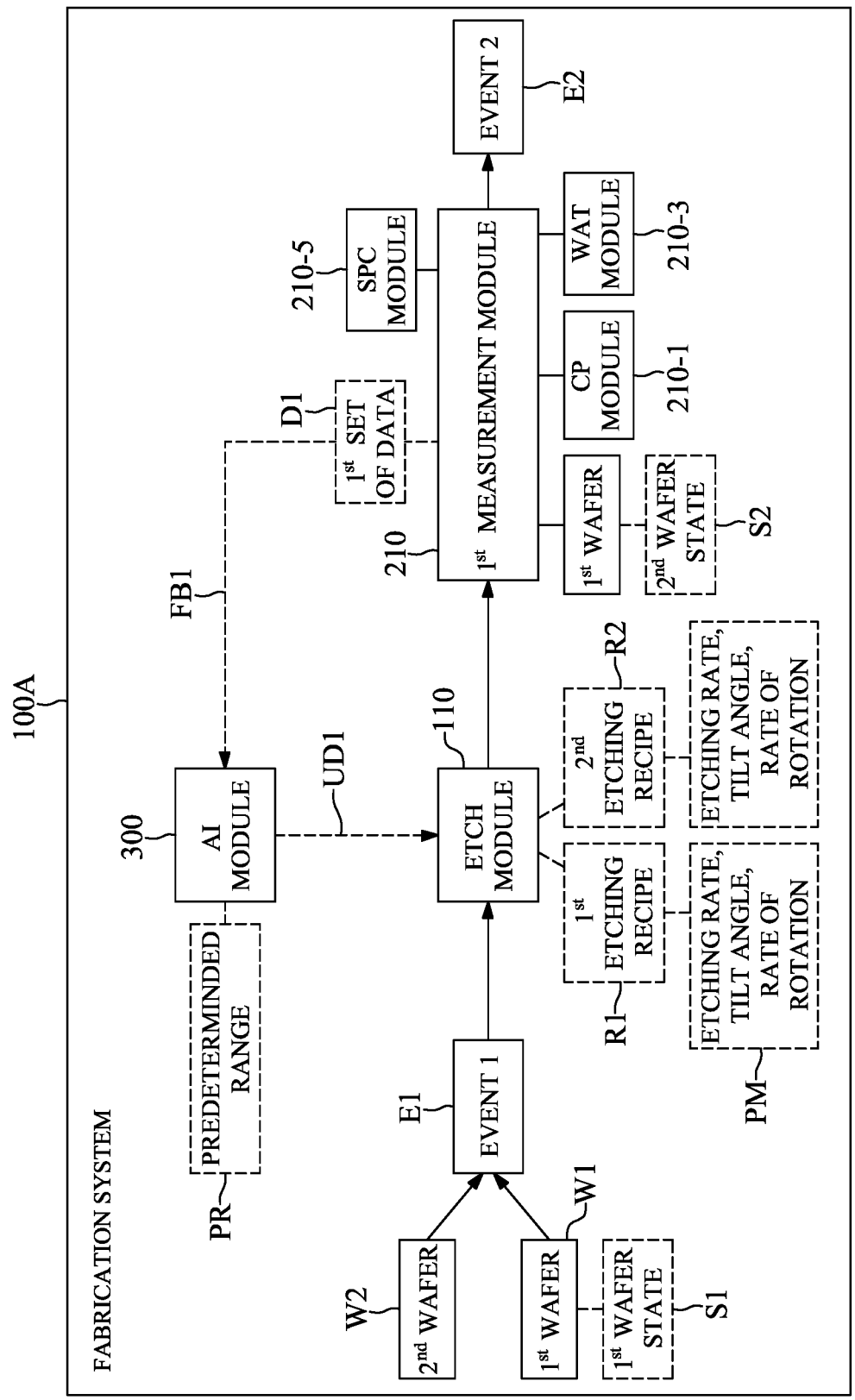
FIG. 2 illustrates an exemplary block diagram of the fabrication system in accordance with one embodiment of the present disclosure.

FIG. 1 illustrates, in a flowchart diagram form, a method 10 for fabricating a semiconductor device employing a fabrication system 100A in accordance with one embodiment of the present disclosure. FIG. 2 illustrates an exemplary block diagram of the fabrication system 100A in accordance with one embodiment of the present disclosure.

With reference to FIGS. 1 and 2, at step S11, an etching recipe may be executed on a current wafer by an etch module 110 of the fabrication system 100A.

With reference to FIG. 2, the diagram may include a material process flow, illustrated as solid lines, and an information flow, illustrated as dashed lines. The material process flow may include part of the process for etching a semiconductor substrate, such as, for example, a wafer.

With reference to FIG. 2, in some embodiments, the first event E1 may be a wafer-in event to transfer the current wafer (also referred to as the first wafer W1) into the etch module 110 which provides means for changing the current wafer from a first wafer state S1 to a second wafer state S2. In the present embodiment, the material process flow may include an etching process for the current wafer. In some embodiments, the current wafer may include a patterned photoresist layer or a patterned hard mask layer on the top before being processed by the etch module 110. In some embodiments, the current wafer may be at the stage of front-end-of-line such as forming the word lines, forming the gate structure, forming the contact, but are not limited thereto. In some embodiments, the current wafer may be at the stage of back-end-of-line such as forming the plugs, or forming top metals, or forming the capacitors, but are not limited thereto.

It should be noted that, in the first event E1, multiple wafers may be likely to be processed grouped in lots, as such, the reference to a wafer in the singular in the present embodiment does not by necessity limit the disclosure to a single wafer, but may be illustrative of a lot including a plurality of wafers, a plurality of lots, or any such grouping of material.

In some embodiments, the etch module 110 may include one or more etching chambers that are not separately illustrated. The current wafer may be placed in the etching chamber, and then may be subjected to the etching process employing the etching recipe. The etching recipe for the current wafer may also be referred to as the first etching recipe R1. In some embodiments, the first etching recipe R1 may be a nominal recipe.

In some embodiments, the etch module 110 may include a graphic user interface (GUI) component (not shown for clarity) and a database (not shown for clarity). The GUI component may be provided that enable users to: view module status; create and edit x-y charts of summary and raw (trace) parametric data for selected wafers; view module alarm logs; configure data collection plans that specify conditions for writing data to the database or to output files; input files to statistical process control (SPC) charting, modeling and spreadsheet programs; examine wafer processing information for specific wafers, and review data that is currently being saved to the database; create and edit SPC charts of process parameters, and set SPC alarms which generate email warnings; run multivariate principal component analysis (PCA) and/or partial least squares (PLS) models; and/or view diagnostics screens in order to troubleshoot and report problems with the etch module 110.

In some embodiments, raw data and trace data from the etch module 110 may be stored as files in the database. The amount of data may depend on the data collection plans configured by the user, as well as the frequency with which processes are performed and which processing modules are run. The data obtained from the etch module 110 may be stored in tables. In some embodiments, the GUI component of the etch module 110 and the database of the etch module 110 may not be required.

With reference to FIG. 2, the fabrication system 100A may include an artificial intelligence module 300 and a first measurement module 210. In some embodiments, the artificial intelligence module (AI) 300 may be coupled to the etch module 110. In some embodiments, the artificial intelligence module 300 and the etch module 110 may be independent elements which physically separate from each other. The communication between the artificial intelligence module 300 and the etch module 110 may use any suitable communication technologies, such as analog technologies (e.g., relay logic), digital technologies (e.g., RS232, Ethernet, or wireless), network technologies (e.g., local area network (LAN), a wide area network (WAN), the Internet), Bluetooth technologies, Near-field communication technologies, and/or any other suitable communication technologies. The communication between the artificial intelligence module 300 and the etch module 110 may be compliant with the general equipment module/semiconductor equipment communications standard (GEM SECS) communications protocol.

In some embodiments, the artificial intelligence module 300 may be integrated in the etch module 110.

In some embodiments, the artificial intelligence module 300 may be coupled to the first measurement module 210. In some embodiments, the artificial intelligence module 300 and the first measurement module 210 may be independent elements which physically separate from each other. The communication between the artificial intelligence module 300 and the first measurement module 210 may use any suitable communication technologies, such as analog technologies (e.g., relay logic), digital technologies (e.g., RS232, Ethernet, or wireless), network technologies (e.g., local area network, a wide area network, the Internet), Bluetooth technologies, Near-field communication technologies, and/or any other suitable communication technologies. The communication between the artificial intelligence module 300 and the first measurement module 210 may be compliant with the general equipment module/semiconductor equipment communications standard communications protocol.

In some embodiments, the artificial intelligence module 300 may operate as a single input single output (SISO) device, as a single input multiple output (SIMO) device, as a multiple input single output (MISO) device, and as a multiple input multiple output (MIMO) device.

In some embodiments, the artificial intelligence module 300 may include any suitable hardware (which can execute software or application in some embodiments), such as, for example, computers, microprocessors, microcontrollers, application specific integrated circuits (ASICs), field-programmable gate arrays (FGPAs), and digital signal processors (DSPs) (any of which can be referred to as a hardware processor), encoders, circuitry to read encoders, memory devices (including one or more EPROMS, one or more EEPROMs, dynamic random access memory ("DRAM"), static random access memory ("SRAM"), and/or flash memory), and/or any other suitable hardware elements.

In the artificial intelligence module 300 may include a GUI component (not shown for clarity) and a database (not shown for clarity). The GUI component of the artificial intelligence module 300 may provide means of interaction between the artificial intelligence module 300 and a user. Authorized users and administrators may use the GUI component to modify the configuration and default parameters of the artificial intelligence module 300. Configuration data may be stored in the database.

In some embodiments, the GUI component of the artificial intelligence module 300 may include a status component for displaying the current status for the artificial intelligence module 300. In addition, the status component may include a charting component for presenting system-related and process-related data to a user using one or more different types of charts.

In some embodiments, the database of the artificial intelligence module 300 may be used for archiving input and output data. For example, the artificial intelligence module 300 may archive received inputs, sent outputs, and actions taken by the artificial intelligence module 300 in a searchable database.

In some embodiments, the artificial intelligence module 300 may include means for data backup and restoration. Also, the searchable database can include model information, configuration information, and historical information and the artificial intelligence module 300 may use the database component to backup and restore model information and model configuration information both historical and current.

Icial intelligence module 300 may include a number of applications including at least one tool-related application, at least one module-related application, at least one sensor-related application, at least one interface-related application, at least one database-related application, at least one GUI-related application, and/or at least one configuration application.

In some embodiments, the artificial intelligence module 300 may include algorithms including one or more of the following, alone or in combination: machine learning, hidden Markov models; recurrent neural networks; convolutional neural networks; Bayesian symbolic methods; general adversarial networks; support vector machines; and/or any other suitable artificial intelligence algorithm.

In some embodiments, the artificial intelligence module 300 may include at least one process model which can predict a second state S2 of the current wafer. For example, a process model for etch rate may be used along with a processing time to compute an etch depth, and a process model for deposition rate may be used along with a processing time to compute a deposition thickness. In some embodiments, the process model may include SPC charts, PLS models, PCA models, fault detection/correction (FDC)

models, and multivariate analysis (MVA) models. In some embodiments, the artificial intelligence module 300 may receive and utilize externally provided data for process parameter limits in the process tool 100. For example, the GUI component of the artificial intelligence module 300 may provide a means for the manual input of the process parameter limits.

In some embodiments, tartificial intelligence module 300 may be used to configure any number of process modules. The artificial intelligence module 300 may collect, provide, process, store, and display data from processes involving process modules and/or measurement modules.

With reference to FIG. 2, after the etching process of the etch module 110 using the first etching recipe R1, the wafer state of the current wafer may be turned into the second wafer state S2 (after the etching process) from the first wafer state S1 (before the etching process) by the etch module 110.

With reference to FIGS. 1 and 2, at step S13, a set of data of the current wafer may be generated by the first measurement module 210.

With reference to FIG. 2, in some embodiments, the current processed wafer may be transferred to the first measurement module 210 after the etching process is completed. The first measurement module 210 may collect a set of data (also referred to as the first set of data D1) of the second state S2 of the current processed wafer. In some embodiments, the first measurement module 210 may include a single measurement device or multiple measurement devices. The first measurement module 210 may include process module related measurement devices and/or external measurement devices.

In some embodiments, the first measurement module 210 may be an after-etching-inspection (AEI) metrology tool. The AEI metrology tool may inspect and check for defects, contamination, and critical dimension (CD) following the etching process. In some embodiments, the first measurement module 210 may include an optical spectrum (e.g., optical critical dimension or OCD) metrology tool to measure CD and/or profiles of etched features.

In some embodiments, the first measurement module 210 may include a chip probe (CP) module 210-1 configured to measure electrical characteristics. For example, the CP module 210-1 may measure the leakage current, by resistance, of a gate, but is not limited thereto.

In some embodiments, the first measurement module 210 may include a wafer acceptance test module (WAT) module 210-3 configured to measure electrical characteristics. For example, the WAT module 210-3 may measure the current, by resistance, of a gate, or the leakage current, by resistance, of a drain of a transistor, but is not limited thereto.

In some embodiments, the first measurement module 210 may include a statistical process control (SPC) module 210-5 configured to provide data related to profile (or topography) of a layer. For example, the SPC module 210-5 may provide data related to profile (or topography) of a tungsten layer of a word line or the thickness variation of a gate oxide layer, but is not limited thereto.

With reference to FIGS. 1 and 2, at step S15, the set of data of the current wafer may be analyzed by the artificial intelligence module 300 and the etching recipe may be updated by the artificial intelligence module when the set of data of the current wafer is not within a predetermined range.

With reference to FIG. 2, in some embodiments, the first set of data D1 of the current processed wafer collected by the first measurement module 210 after the etching process may be analyzed by the artificial intelligence module 300 to determine that the data is within a predetermined range PR (e.g., an acceptance criteria or a specification). If the first set of data D1 is not within the predetermined range PR, the first set of data D1 of the current processed wafer collected by the first measurement module 210 may be fed back to the artificial intelligence module 300 which coupled to the etch module 110 (as shown in dashed arrow FB1). The artificial intelligence module 300 may update the first etching recipe R1 according to the feedback data to provide a second etching recipe R2 for the next wafer (as shown in dashed arrow UD1). The next wafer may be also referred to as the second wafer W2.

In some embodiments, the parameters PM, such as gas ratio and/or flow rate, of the first etching recipe R1 may be updated, by the artificial intelligence module 300, to generate the second etching recipe R2. In some embodiments, the etching rate the first etching recipe R1 may be updated, by the artificial intelligence module 300, according to the feedback data. In some embodiments, the tilt angle of a wafer configured by the first etching recipe R1 may be updated, by the artificial intelligence module 300, according to the feedback data. In some embodiments, the rate of rotation of a wafer configured by the first etching recipe R1 may be updated, by the artificial intelligence module 300, according to the feedback data. In contrast, when the data is within the predetermined range PR, the first etching recipe R1 may be kept and be applied to the next wafer. In other words, the etching recipe may be immediately updated or adjusted within a wafer-to-wafer time frame.

In some embodiments, the artificial intelligence module 300 may use the data of the current processed wafer collected by the first measurement module 210 after the etching process to compute a set of process deviations. This computed set of process deviations may be determined based on the target data and the data of the current processed wafer collected by the first measurement module 210 after the etching process. The set of process deviations may be used to determine a correction to the first etching recipe R1 for the next wafer to be processed. In the description of the present disclosure, a target data indicates the desired specification after the process is completed.

In some embodiments, the artificial intelligence module 300 may use table-based and/or formula-based techniques. For example, the recipes may be in a table, and the artificial intelligence module 300 does a table lookup to determine which correction or corrections provide the best solutions. Alternately, the corrections may be determined using a set of formulas, and the artificial intelligence module 300 determines which correction formula or corrections formulas provide the best solutions.

When the artificial intelligence module 300 uses table-based techniques, the feedback control variables are configurable. For example, a variable can be a constant or coefficient in the table. In addition, there can be multiple tables, and rule-based switching can be accomplished based on an input range or an output range.

When the artificial intelligence module 300 uses formula-based control, the feedback control variables are configurable. For example, a variable can be a constant or coefficient in the formula. In addition, there can be multiple formula combinations, and rule-based switching can be accomplished based on an input range or an output range.

With reference to FIG. 2, the second event E2 may represent a following process for the current processed wafer. In the present embodiment, the second event E2 may be a clean process, a deposition process, or other applicable processes.

By employing the artificial intelligence module 300 coupled to the etch module 110 and the first measurement module 210, the related process recipe (e.g., the etching recipe in the present embodiment) may be updated (or adjusted) according to the data collected by the first measurement module 210. The next wafer may employ the updated (or adjusted) recipe so as to obtain parameters within acceptance criteria. As a result, the overall yield and/or reliability of the wafers may be improved.

In some embodiments, the first measurement module 210 may include the CP module 210-1, the WAT module 210-3, and the SPC module 210-5. The current processed wafer may be transferred to the modules separately to collect data. The data collected by the modules may be fed back to the artificial intelligence module 300 separately. For example, the SPC module 210-5 may collect data related to the profile (or topography) of the tungsten layer of the word line of the wafer. The data collected by the SPC module 210-5 may be fed back to the artificial intelligence module 300. Then, the wafer may continue the fabrication procedure of forming the gate. The CP module 210-1 and/or WAT module 210-3 may separately collect the resistance data of the gate of the wafer and fed back to the artificial intelligence module 300.

In some embodiments, the first measurement module 210 may be integrated within the etch module 110. In some embodiments, the first measurement module 210 may be a set of sensors which can monitor process-related parameters such as gas flow, gas ratio, or other applicable process-related parameters.

In some embodiments, the first measurement module 210 may provide feedback data to the artificial intelligence module 300 in a real time manner. Accordingly, the artificial intelligence module 300 may update the etching recipe immediately. For example, the first etching recipe may be a multi-stage recipe such as a two-stage recipe. The first measurement module 210 may continuously monitor process-related parameters during the first stage of the first etching recipe R1 and feed back to the artificial intelligence module 300 (as shown in dashed arrow FB1).

Meanwhile, the artificial intelligence module 300 may analyze the feedback data to determine whether to update the second stage of the first etching recipe R1 or not. If the first stage of the first etching recipe R1 includes a process deviation, the artificial intelligence module 300 can make correction and update (as shown in dashed arrow UD1) the second stage of the first etching recipe R1 to make the processed wafer have parameters (e.g., CD, resistance, and/or profile) within the acceptance criteria.

Accordingly, the first measurement module 210 may also continuously monitor process-related parameters during and after the second stage of the first etching recipe R1 and feed back to the artificial intelligence module 300. Meanwhile, the artificial intelligence module 300 may analyze the feedback data to determine whether to update the first etching recipe R1 for the next wafer to be processed.

In some embodiments, the artificial intelligence module 300 may be configured for determining an etching rate of a material layer on the wafer and controlling the rate of rotation of the wafer in response to the determined etching rate/tilt angle in order to control a final thickness profile of the material layer.

Figure 3:
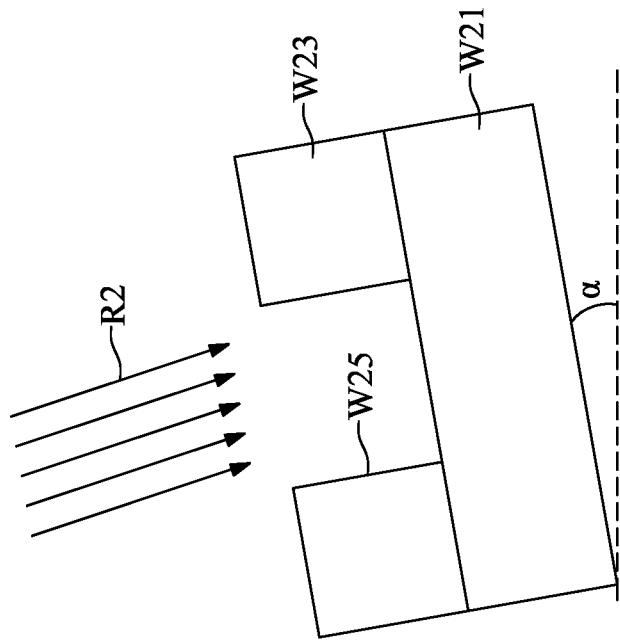
FIG. 3 illustrates, in a schematic cross-sectional view diagram, a first wafer processed by an etch module using a first etching recipe and a second wafer processed by the etch module using a second etching recipe in accordance with one embodiment of the present disclosure.
Figure 3:
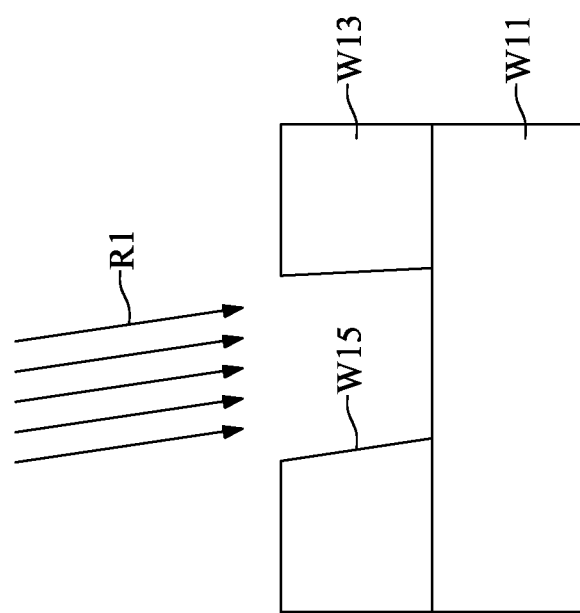

FIG. 3 illustrates, in a schematic cross-sectional view diagram, the first wafer W1 processed by the etch module 110 using the first etching recipe R1 and the second wafer W2 processed by the etch module 110 using the second etching recipe R2 in accordance with one embodiment of the present disclosure.

With reference to FIG. 3, the first wafer W1 (i.e., the current wafer) may include a substrate W11 and a dielectric layer W13 disposed on the substrate W11. The etching process employing the etch module 110 using the first etching recipe R1 may be performed on the first wafer W1 to form a recess W15 along the dielectric layer W13. The first wafer W1 including the recess W15 may be referred to as the processed current wafer. The related parameters, such as CD and/or profile of the recess W15 may be measured by the first measurement module 210 to generate the first set of data D1. The first set of data D1 may be analyzed by the artificial intelligence module 300 to determine whether to update the first etching recipe R1. As shown in FIG. 3, the CD and/or profile may be not within the predetermined range (the sidewall profile of the recess W15 is not straight and symmetric).

Therefore, the artificial intelligence module 300 may update the parameters of the first etching recipe R1 such as tilt angle, etching rate and/or rate of rotation of the first etching recipe R1 to generate the second etching recipe R2.

In contrast, the second wafer W2 (i.e., the next wafer) including the substrate W21 and the dielectric layer W23 disposed on the substrate W21 may be processed by the etch module 110 using the second etching recipe R2 having updated recipe parameters such as the tilt angle $\alpha$. By employing the second etching recipe R2, the related parameters (e.g., the sidewall profile of the recess W25) of the second wafer may be within the predetermined range.

Figure 4:
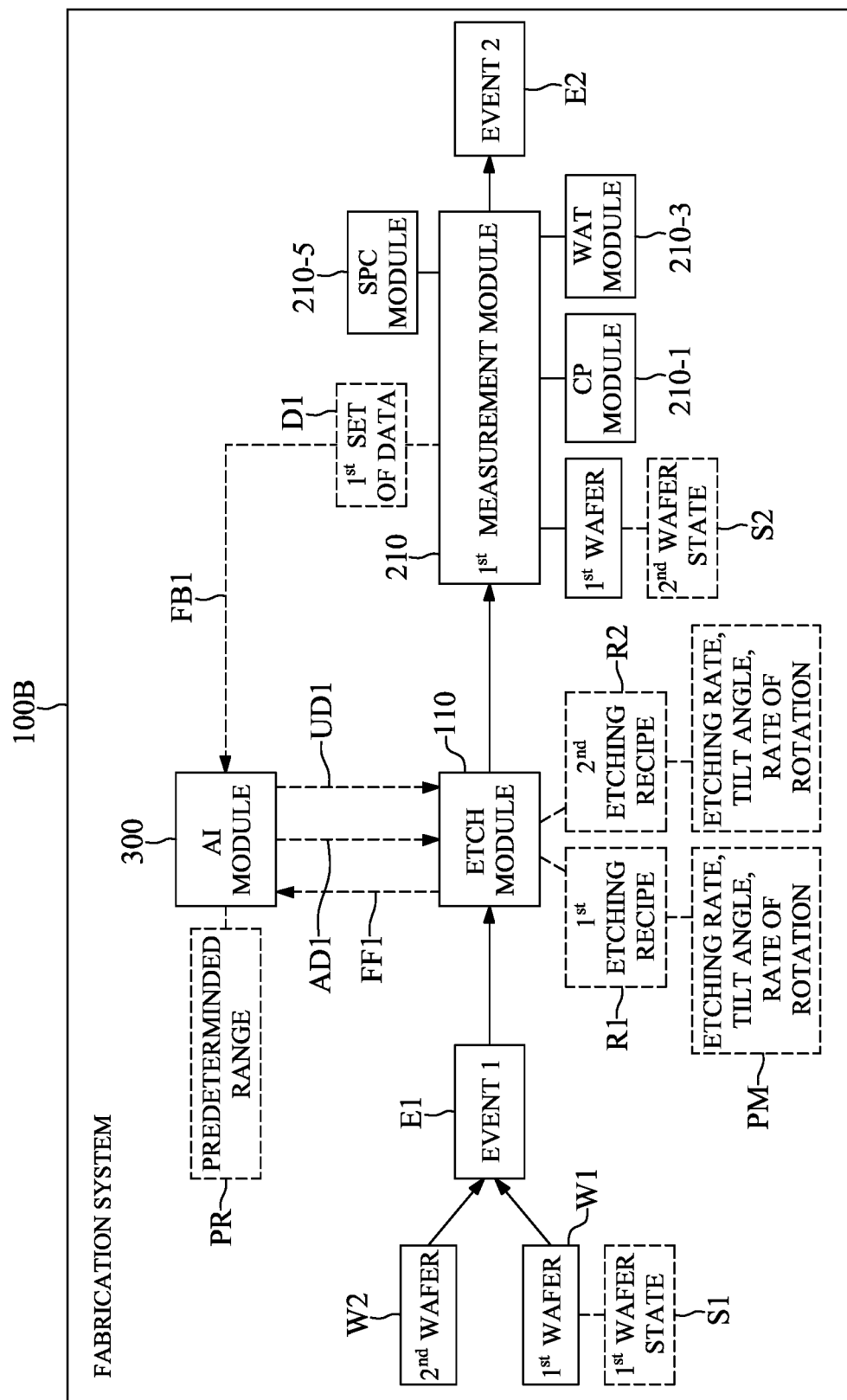
FIGS. 4 to 6 illustrate exemplary block diagrams of fabrication systems in accordance with some embodiments of the present disclosure.
Figure 5:
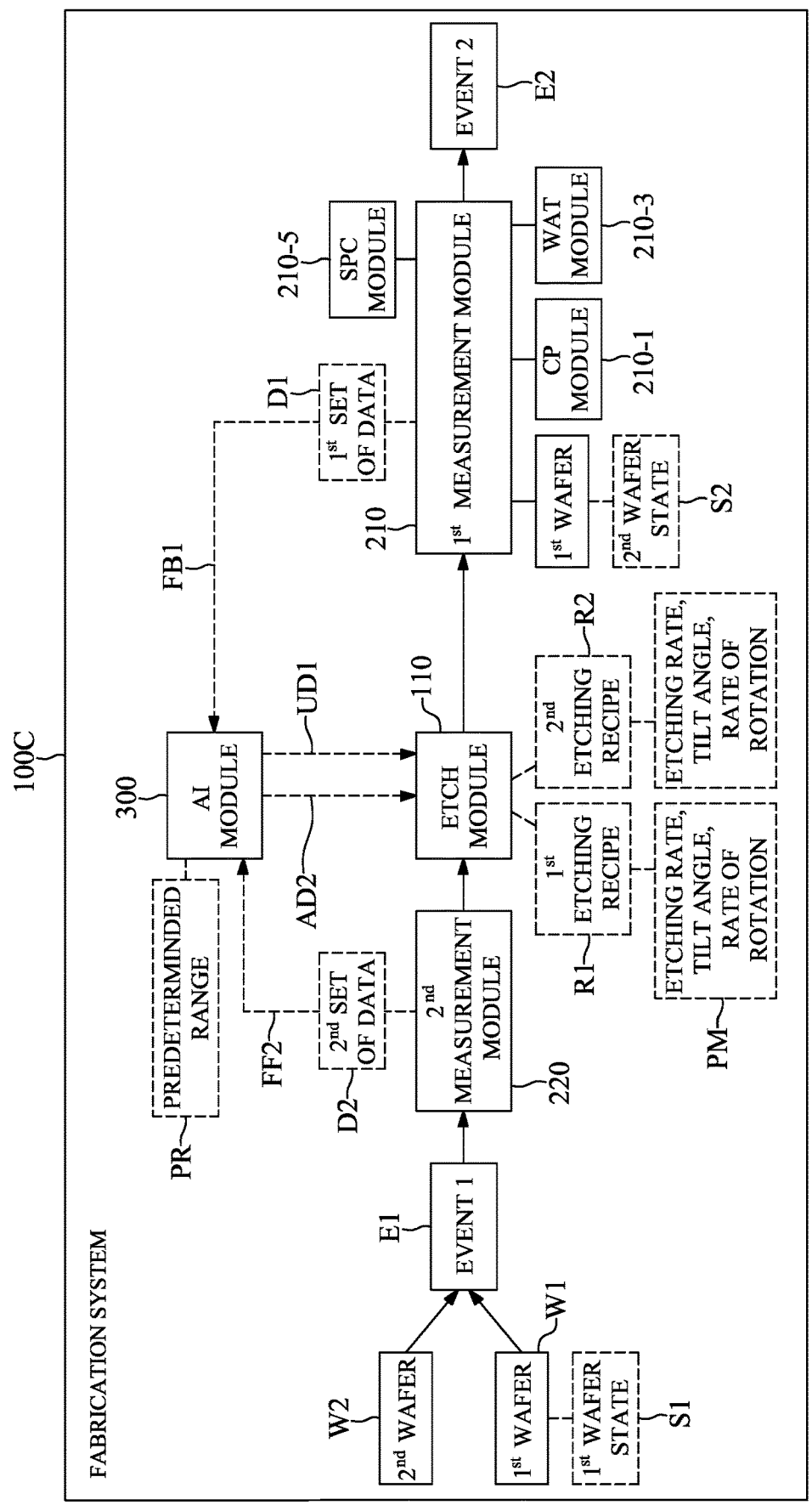
Figure 6:
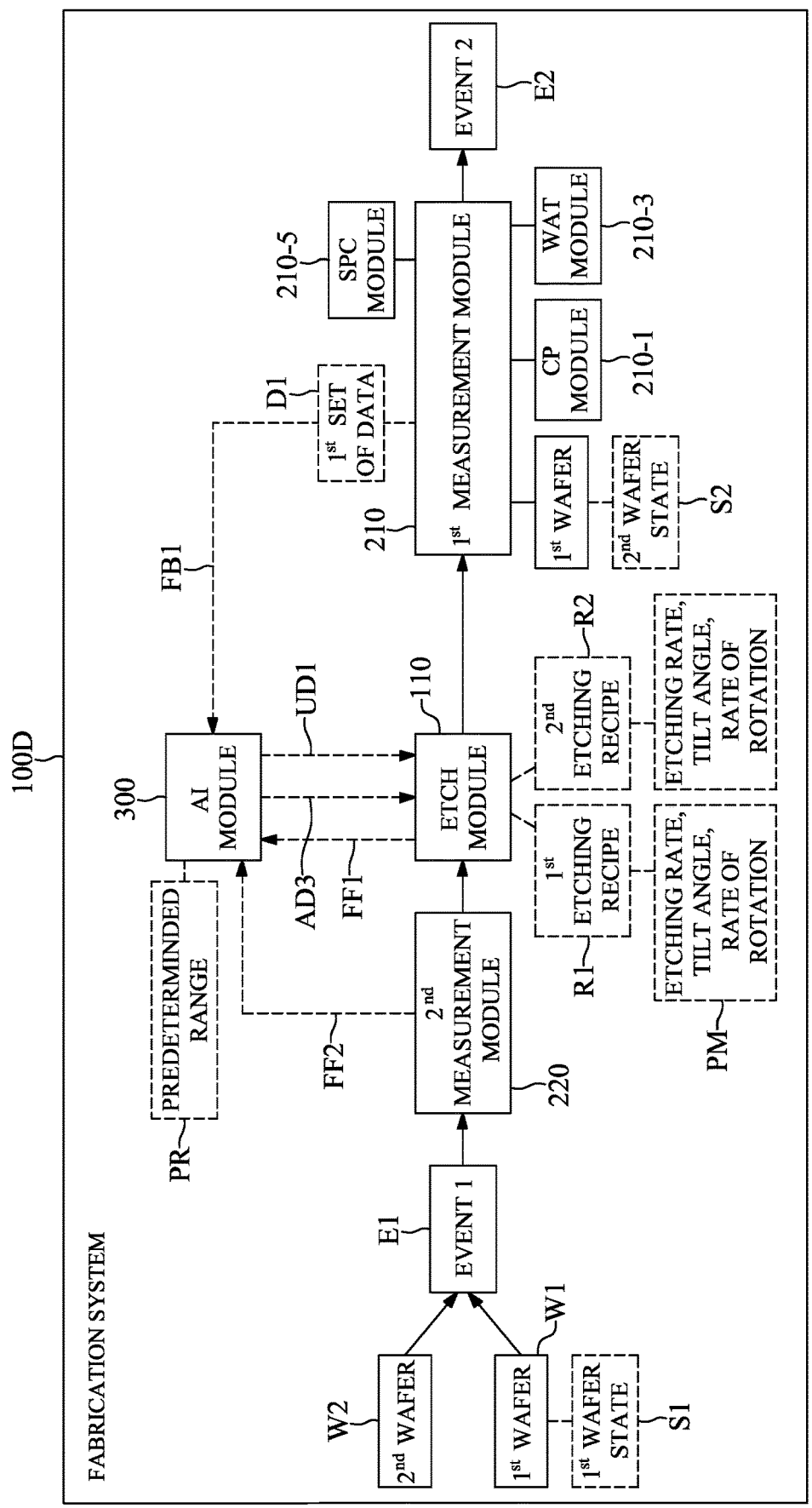

FIGS. 4 to 6 illustrate exemplary block diagrams of fabrication systems 100B, 100C, 100D in accordance with some embodiments of the present disclosure.

With reference to FIG. 4, the block diagram may illustrate the fabrication system 100B similar to that illustrated in FIG. 2. The same or similar elements in FIG. 4 as in FIG. 2 have been marked with similar reference numbers and duplicative descriptions have been omitted.

With reference to FIG. 4, before the etch module 110 processes the current wafer of the first event E1, the trace data of the etch module 110 such as module trace data, maintenance data, end point detection (EPD) data, and/or other process-related data may be fed forward to the artificial intelligence module 300 (as shown in dashed arrow FF1). The artificial intelligence module 300 may analyze the trace data of the etch module 110 to adjust the etching recipe for processing the current wafer (as shown in dashed arrow AD1). After the process is completed, the artificial intelligence module 300 may also update the adjusted etching recipe according to the feedback data of the first measurement module 210.

With reference to FIG. 5, the block diagram may illustrate the fabrication system 100C similar to that illustrated in FIG. 2. The same or similar elements in FIG. 5 as in FIG. 2 have been marked with similar reference numbers and duplicative descriptions have been omitted.

With reference to FIG. 5, the current wafer may be transferred to a second measurement module 220 before being processed by the etch module 110. In some embodiments, the second measurement module 220 may include a single measurement device or multiple measurement devices. The second measurement module 220 may include module related measurement devices and/or external measurement devices. In the present embodiment, the second measurement module 220 may be an after-development-inspection (ADI) metrology tool. In some embodiments, the second measurement module 220 may include an optical spectrum (e.g., optical critical dimension or OCD) metrology tool to measure CD and/or profiles of etched features.

The second measurement module 220 measures critical dimensions and profiles of the patterned photoresist layer on the top of the current wafer. The measured CD may be fed forward to the artificial intelligence module 300 (as shown in dashed arrow FF2). The measured CD by the second measurement module 220 may be referred to as the second set of data D2.

Before the etch module 110 processes the current wafer, the artificial intelligence module 300 may use the difference between the feedforward data of the second measurement module 220 and the target CD to select or calculate a set of process parameters to achieve the desired result. The adjusted recipe may be applied to the etch module 110 for processing the current wafer (as shown in dashed arrow AD2). In some embodiments, the feedforward data may also include data associated with the current wafer such as lot data, batch data, run data, composition data, and wafer history data. After the process is completed, the artificial intelligence module 300 may also update the adjusted etching recipe according to the feedback data of the first measurement module 210.

With reference to FIG. 6, the block diagram may illustrate the fabrication system 100D similar to that illustrated in FIG. 5. The same or similar elements in FIG. 6 as in FIG. 5 have been marked with similar reference numbers and duplicative descriptions have been omitted.

With reference to FIG. 6, before the etch module 110 processes the current wafer of the first event E1, the trace data of the etch module 110 such as module trace data, maintenance data, end point detection data, and/or other process-related data may be fed forward to the artificial intelligence module 300 (as shown in dashed arrow FF1). In addition, the measured data by the second measurement module 220 may be also fed forward to the artificial intelligence module 300 (as shown in dashed arrow FF2). The artificial intelligence module 300 may analyze the trace data of the etch module 110 and the measured data by the second measurement module 220 to adjust the etching recipe for processing the current wafer (as shown in dashed arrow AD3). After the process is completed, the artificial intelligence module 300 may also update the adjusted etching recipe according to the feedback data of the first measurement module 210.

Figure 7:
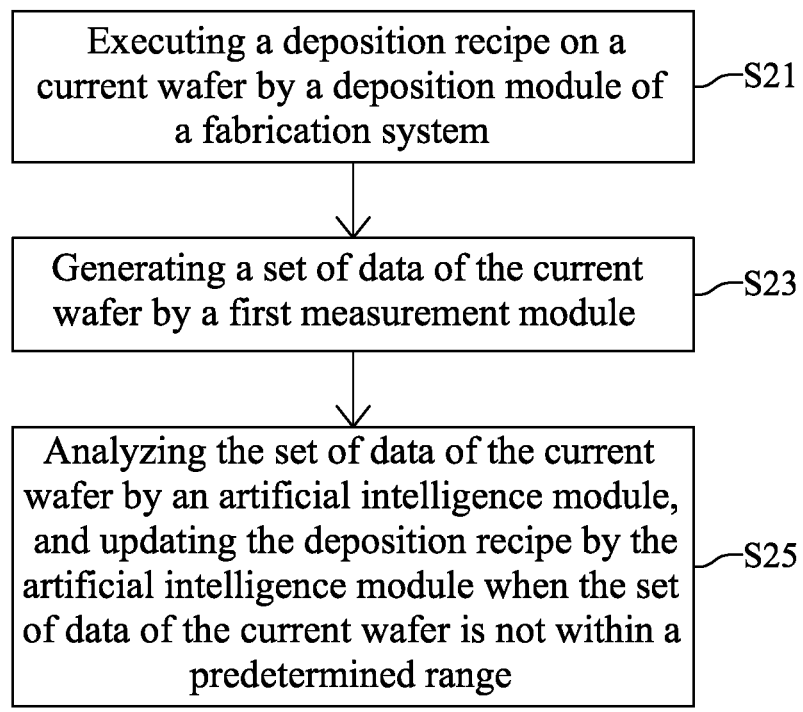
FIG. 7 illustrates, in a flowchart diagram form, a method for fabricating a semiconductor device employing a fabrication system in accordance with another embodiment of the present disclosure.
Figure 8:
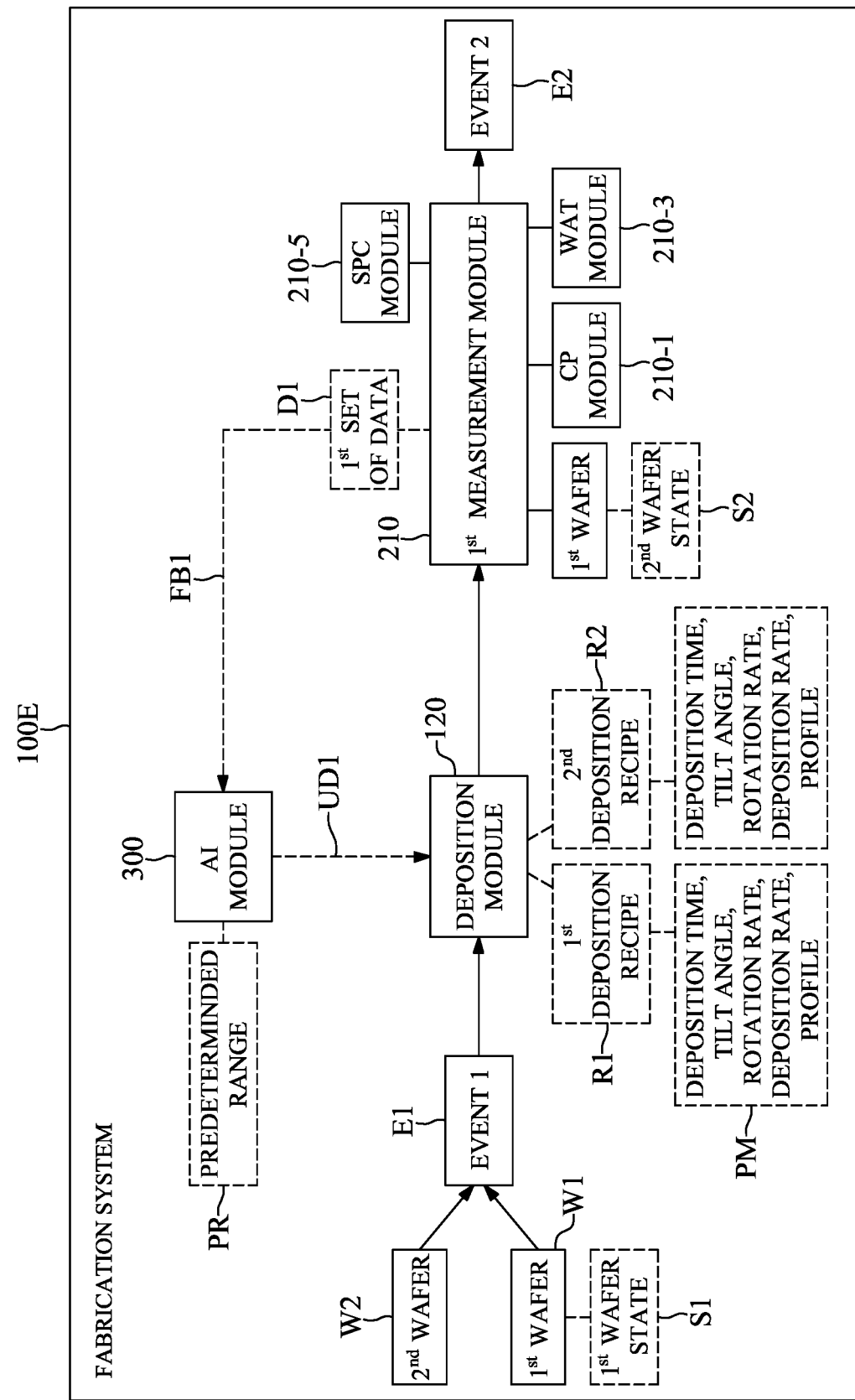
FIG. 8 illustrates an exemplary block diagram of the fabrication system in accordance with another embodiment of the present disclosure.

FIG. 7 illustrates, in a flowchart diagram form, a method 20 for fabricating a semiconductor device employing a fabrication system 100E in accordance with another embodiment of the present disclosure. FIG. 8 illustrates an exemplary block diagram of the fabrication system 100E in accordance with another embodiment of the present disclosure.

With reference to FIGS. 7 and 8, at step S21, a deposition recipe may be executed on a current wafer by a deposition module 120 of the fabrication system 100E.

With reference to FIG. 8, in some embodiments, the first event E1 may be a wafer-in event to transfer the current wafer (also referred to as the first wafer W1) into the deposition module 120 which provides means for changing the current wafer from a first wafer state S1 to a second wafer state S2. In the present embodiment, the material process flow may include a deposition process for the current wafer. In some embodiments, the current wafer may be at the stage of front-end-of-line such as forming the word lines, forming the gate structure, forming the contact, but are not limited thereto. In some embodiments, the current wafer may be at the stage of back-end-of-line such as forming the plugs, or forming top metals, or forming the capacitors, but are not limited thereto.

It should be noted that, in the first event E1, multiple wafers may be likely to be processed grouped in lots, as such, the reference to a wafer in the singular in the present embodiment does not by necessity limit the disclosure to a single wafer, but may be illustrative of a lot including a plurality of wafers, a plurality of lots, or any such grouping of material.

In some embodiments, the deposition module 120 may include a deposition chamber that is not separately illustrated. The current wafer may be placed in the deposition chamber, and then may be subjected to the deposition process employing a deposition recipe. The deposition recipe for the current wafer may also be referred to as the first deposition recipe R1. In some embodiments, the first deposition recipe R1 may be a nominal recipe.

In some embodiments, the deposition module 120 may include a GUI component and a database similar to the GUI component and the database of the etch module 110 illustrated in FIG. 2, and descriptions thereof are not repeated herein.

With reference to FIG. 8, the artificial intelligence module 300 may be coupled to the deposition module 120. The communication between the deposition module 120 and the artificial intelligence module 300 may be similar to the communication between the etch module 110 and the artificial intelligence module 300 illustrated in FIG. 2, and descriptions thereof are not repeated herein. In some embodiments, the artificial intelligence module 300 may be integrated in the deposition module 120.

With reference to FIG. 8, after the deposition process of the deposition module 120 using the first deposition recipe R1, the wafer state of the current wafer may be turned into the second wafer state S2 (after the deposition process) from the first wafer state S1 (before the deposition process) by the deposition module 120.

With reference to FIGS. 7 and 8, at step S23, a set of data of the current wafer may be generated by a first measurement module 210.

With reference to FIG. 8, the current processed wafer may be transferred to the first measurement module 210 after the deposition process is completed. The first measurement module 210 may collect a set of data (also referred to as the first set of data D1) of the second state of the current processed wafer. In some embodiments, the first measurement module 210 may include a single measurement device or multiple measurement devices. The first measurement module 210 may include process module related measurement devices and/or external measurement devices. In the present embodiment, the first measurement module 210 may be a metrology tool for measuring film thickness.

In some embodiments, the first measurement module 210 may include a chip probe (CP) module 210-1 configured to measure electrical characteristics. For example, the CP module 210-1 may measure the leakage current, by resistance, of a gate, but is not limited thereto.

In some embodiments, the first measurement module 210 may include a wafer acceptance test module (WAT) module 210-3 configured to measure electrical characteristics. For example, the WAT module 210-3 may measure the current, by resistance, of a gate, or the leakage current, by resistance, of a drain of a transistor, but is not limited thereto.

In some embodiments, the first measurement module 210 may include a statistical process control (SPC) module 210-5 configured to provide data related to profile (or topography) of a layer. For example, the SPC module 210-5 may provide data related to profile (or topography) of a tungsten layer of a word line, or the profile (or topography) and/or thickness variation of a gate oxide layer, but is not limited thereto.

With reference to FIGS. 7 and 8, at step S25, the set of data of the current wafer may be analyzed by the artificial intelligence module 300 and the first deposition recipe may be updated by the artificial intelligence module when the set of data of the current wafer is not within a predetermined range.

With reference to FIG. 8, in some embodiments, the first set of data D1 of the current processed wafer collected by the first measurement module 210 after the deposition process may be analyzed by the artificial intelligence module 300 to determine that the first set of data D1 is within a predetermined range PR. If the first set of data D1 is not within the predetermined range (e.g., acceptance criteria or specifications), the first set of data D1 of the current processed wafer collected by the first measurement module 210 may be fed back to the artificial intelligence module 300 which coupled to the deposition module 120 (as shown in dashed arrow FB1). The artificial intelligence module 300 may update the first deposition recipe R1 according to the feedback data to provide a second deposition recipe R2 for the next wafer (as shown in dashed arrow UD1). The next wafer may be also referred to as the second wafer W2.

In some embodiments, the parameters PM, such as deposition time, of the first deposition recipe R1 may be updated to generate the second deposition recipe R2. In some embodiments, the tilt angle of the wafer of the first deposition recipe R1 may be updated according to the feedback data. In some embodiments, the rotation rate of wafer of the first deposition recipe R1 may be updated according to the feedback data. In contrast, when the data is within the predetermined range PR, the first deposition recipe R1 may be kept and be applied to the next wafer. In other words, the deposition recipe may be immediately updated or adjusted within a wafer-to-wafer time frame.

In some embodiments, the artificial intelligence module 300 may use the first set of data D1 of the current processed wafer collected by the first measurement module 210 after the deposition process to compute a set of process deviations. This computed set of process deviations may be determined based on the target data and the data of the current processed wafer collected by the first measurement module 210 after the deposition process. The set of process deviations may be used to determine a correction to the first deposition recipe for the next wafer to be processed.

In some embodiments, the artificial intelligence module 300 may use table-based and/or formula-based techniques. For example, the recipes may be in a table, and the artificial intelligence module 300 does a table lookup to determine which correction or corrections provide the best solutions. Alternately, the corrections may be determined using a set of formulas, and the artificial intelligence module 300 determines which correction formula or corrections formulas provide the best solutions.

When the artificial intelligence module 300 uses table-based techniques, the feedback control variables are configurable. For example, a variable can be a constant or coefficient in the table. In addition, there can be multiple tables, and rule-based switching can be accomplished based on an input range or an output range.

When the artificial intelligence module 300 uses formula-based control, the feedback control variables are configurable. For example, a variable can be a constant or coefficient in the formula. In addition, there can be multiple formula combinations, and rule-based switching can be accomplished based on an input range or an output range.

With reference to FIG. 8, the second event E2 may represent a following process for the current process wafer. In the present embodiment, the second event E2 may be a planarization process, or other applicable processes.

By employing the artificial intelligence module 300 coupled to the deposition module 120 and the first measurement module 210, the related process recipe (e.g., the deposition recipe in the present embodiment) may be updated (or adjusted) according to the data collected by the first measurement module 210. The next wafer may employ the updated (or adjusted) recipe so as to obtain parameters within acceptance criteria. As a result, the overall yield and/or reliability of the wafers may be improved.

In some embodiments, the first measurement module 210 may include the CP module 210-1, the WAT module 210-3, and the SPC module 210-5. The current processed wafer may be transferred to the modules separately to collect data thereof. The data collected by the modules may be fed back to the artificial intelligence module 300 separately. For example, the SPC module 210-5 may collect data related to the profile (or topography) of the tungsten layer of the word line of the wafer. The data collected by the SPC module 210-5 may be fed back to the artificial intelligence module 300. Then, the wafer may continue the fabrication procedure of forming the gate. The CP module 210-1 and/or WAT module 210-3 may separately collect the resistance data of the gate of the wafer and fed back to the artificial intelligence module 300.

In some embodiments, the first measurement module 210 may be integrated within the deposition module 120. In some embodiments, the first measurement module 210 may be a set of sensors which can monitor process-related parameters such as thickness, profile, or other applicable process-related parameters.

In some embodiments, the first measurement module 210 may provide feedback data to the artificial intelligence module 300 in a real time manner. Accordingly, the artificial intelligence module 300 may update the deposition recipe immediately. For example, the first deposition recipe may be a multi-stage recipe such as a two-stage recipe. The first measurement module 210 may continuously monitor process-related parameters during the first stage of the first deposition recipe R1 and feed back to the artificial intelligence module 300 (as shown in dashed arrow FB1). Meanwhile, the artificial intelligence module 300 may analyze the feedback data to determine whether to update the second stage of the first deposition recipe R1 or not. If the first stage of the first deposition recipe R1 includes a process deviation, the artificial intelligence module 300 can make correction and update (as shown in dashed arrow UD1) the second stage of the first deposition recipe R1 to make the processed wafer have parameters (e.g., thickness, resistance, and/or profile) within the acceptance criteria.

Accordingly, the first measurement module 210 may also continuously monitor process-related parameters during and after the second stage of the first deposition recipe R1 and feed back to the artificial intelligence module 300. Meanwhile, the artificial intelligence module 300 may analyze the feedback data to determine whether to update the first deposition recipe R1 for the next wafer to be processed.

In some embodiments, the artificial intelligence module 300 may be configured for determining a deposition rate of a material layer to be formed on the wafer and controlling the rotation rate/tile angle of the wafer in response to the determined deposition rate in order to control a final thickness profile of the material layer. In some embodiments, some other process-related parameters PM of the deposition recipe may also be configured by the artificial intelligence module 300.

Figure 9:
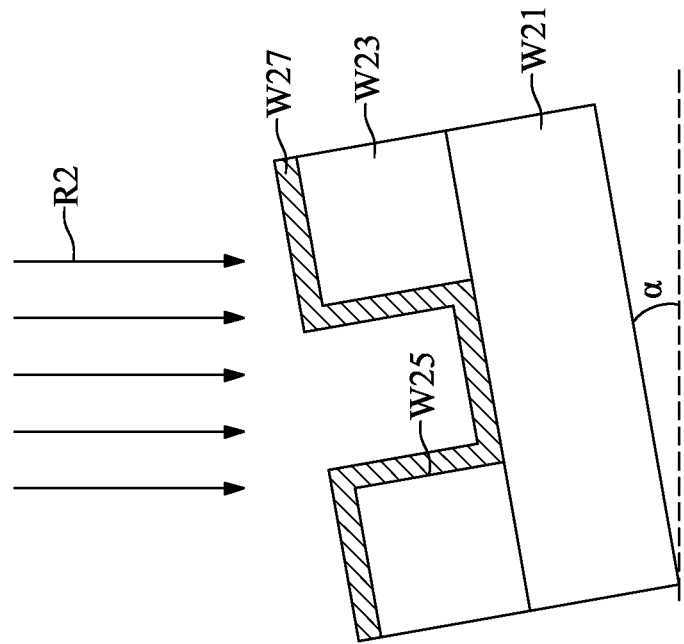
FIG. 9 illustrates, in a schematic cross-sectional view diagram, a first wafer processed by a deposition module using a first deposition recipe and a second wafer processed by the deposition module using a second deposition recipe in accordance with another embodiment of the present disclosure.
Figure 9:
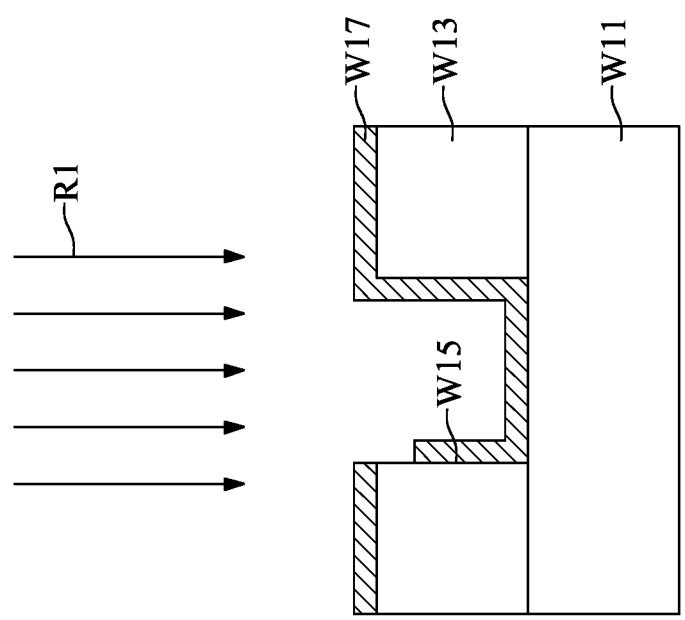

FIG. 9 illustrates, in a schematic cross-sectional view diagram, the first wafer W1 processed by the deposition module 120 using the first deposition recipe R1 and the second wafer W2 processed by the deposition module 120 using the second deposition recipe R2 in accordance with another embodiment of the present disclosure.

With reference to FIG. 9, the first wafer W1 (i.e., the current wafer) may include a substrate W11, a dielectric layer W13 disposed on the substrate W11, and a recess W15 along the dielectric layer W13. The deposition process employing the deposition module 120 using the first deposition recipe R1 may be performed on the first wafer W1 to conformally form an oxide layer W17 in the recess W15 and on the dielectric layer W13. The first wafer W1 including the oxide layer W17 may be referred to as the processed current wafer. The related parameters, such as thickness, coverage, step coverage, and/or profile of the oxide layer W17 may be measured by the first measurement module 210 to generate the first set of data D1. The first set of data D1 may be analyzed by the artificial intelligence module 300 to determine whether to update the first deposition recipe R1. As shown in FIG. 9, the step coverage and/or profile may not be within the predetermined range (the oxide layer W17 is not continuous). Therefore, the artificial intelligence module 300 may update the parameters of the first deposition recipe R1 such as tilt angle, deposition rate, and/or rate of rotation of the first deposition recipe R1 to generate the second deposition recipe R2.

In contrast, the second wafer W2 (i.e., the next wafer) including the substrate W21, the dielectric layer W23 disposed on the substrate W21, and a recess W25 along the dielectric layer W23 may be processed by the deposition module 120 using the second deposition recipe R2 having updated recipe parameters such as the tilt angle α. By employing the second deposition recipe R2, the related parameters (e.g., the coverage of the oxide layer W27) of the second wafer may be within the predetermined range.

Figure 10:
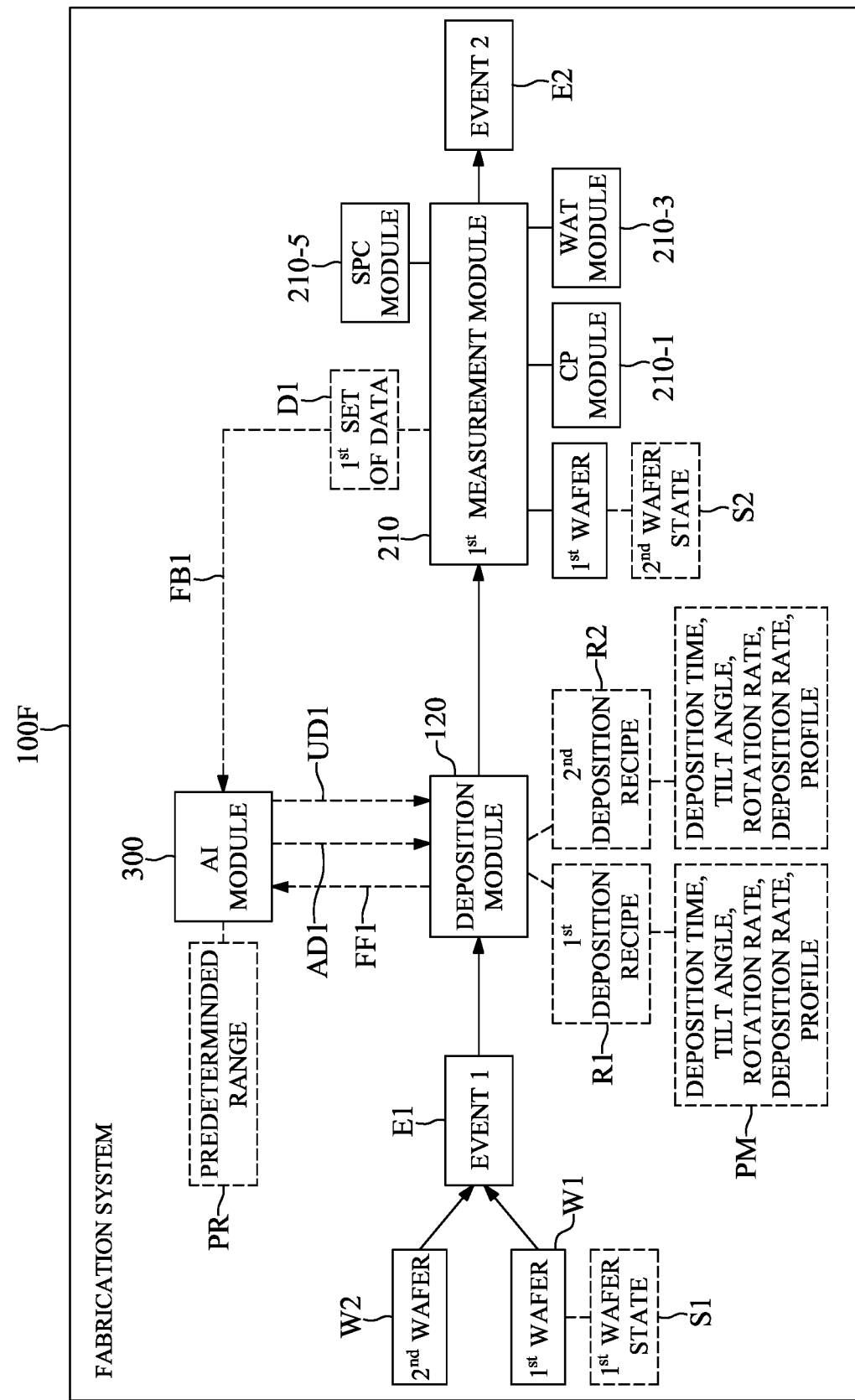
FIG. 10 illustrates an exemplary block diagram of a fabrication system in accordance with another embodiment of the present disclosure.

FIG. 10 illustrates an exemplary block diagram of a fabrication system 100F in accordance with another embodiment of the present disclosure.

With reference to FIG. 10, the block diagram may illustrate the fabrication system 100F similar to that illustrated in FIG. 8. The same or similar elements in FIG. 10 as in FIG. 8 have been marked with similar reference numbers and duplicative descriptions have been omitted.

With reference to FIG. 10, before the deposition module 120 processes the current wafer of the first event E1, the trace data of the deposition module 120 such as module trace data, maintenance data, and/or other process-related data may be fed forward to the artificial intelligence module 300 (as shown in dashed arrow FF1). The artificial intelligence module 300 may analyze the trace data of the deposition module 120 to adjust the deposition recipe for processing the current wafer (as shown in dashed arrow AD1). After the process is completed, the artificial intelligence module 300 may also update the adjusted deposition recipe according to the feedback data of the first measurement module 210.

Figure 11:
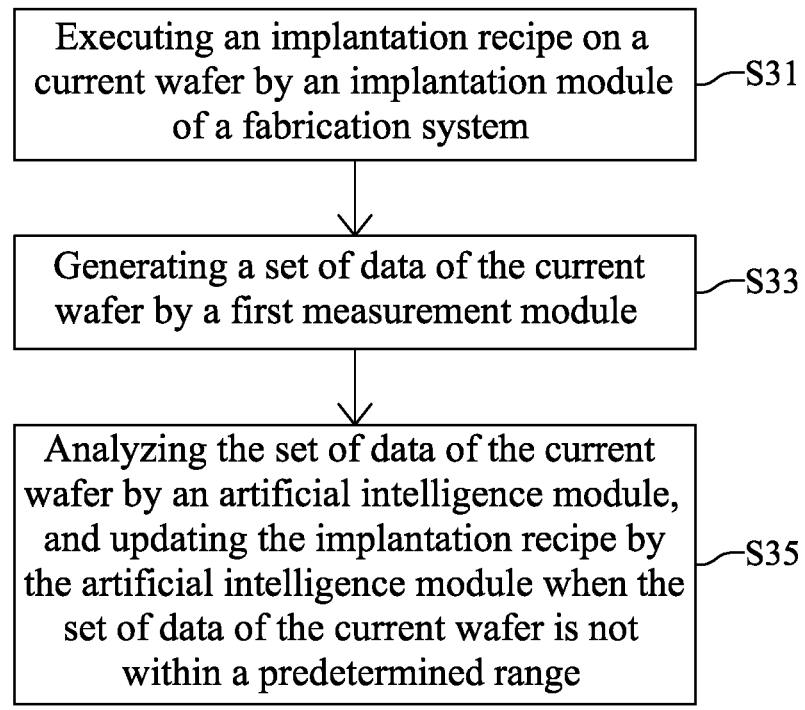
FIG. 11 illustrates, in a flowchart diagram form, a method for fabricating a semiconductor device employing a fabrication system in accordance with another embodiment of the present disclosure.
Figure 12:
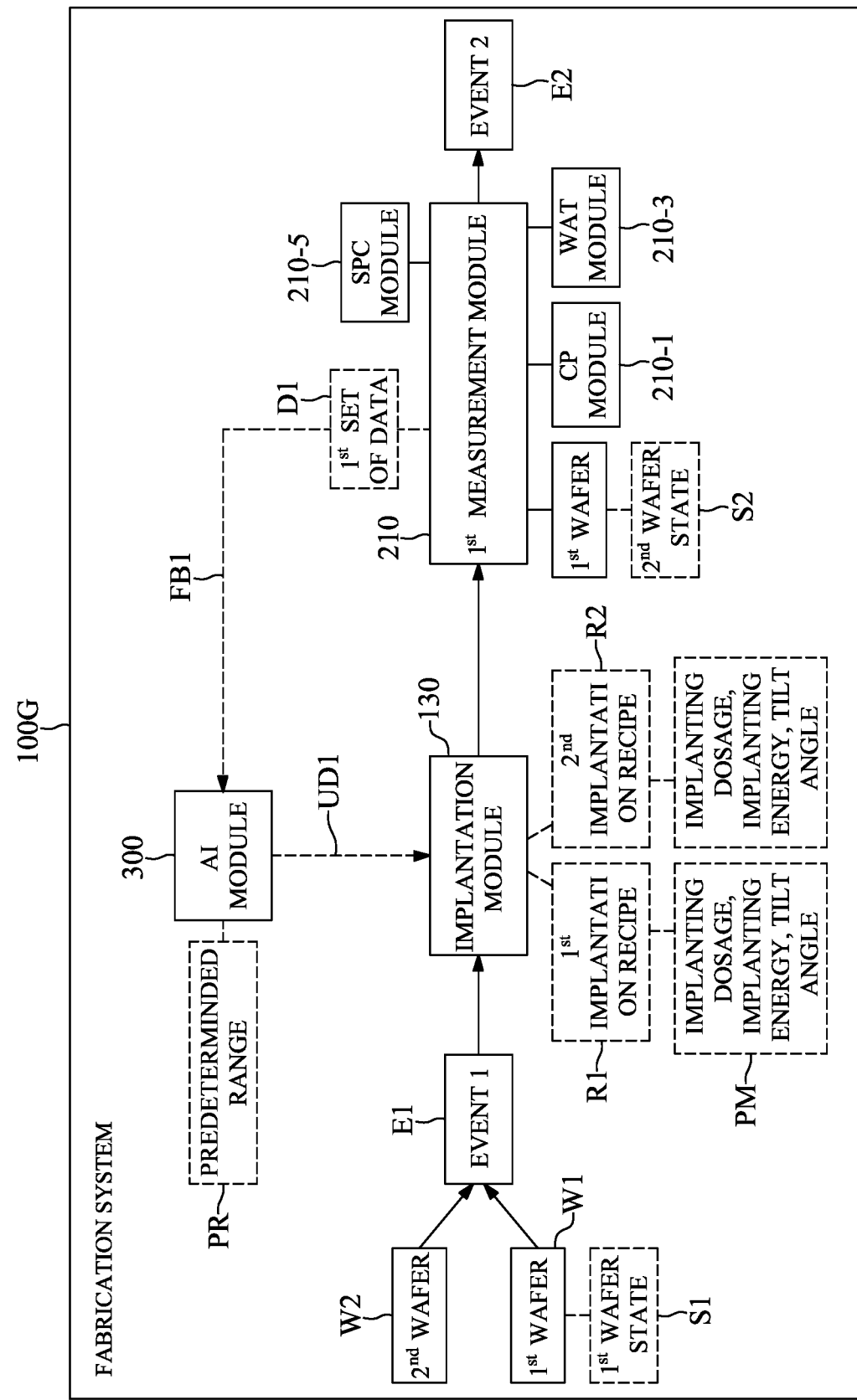
FIG. 12 illustrates an exemplary block diagram of the fabrication system in accordance with another embodiment of the present disclosure.

FIG. 11 illustrates, in a flowchart diagram form, a method 30 for fabricating a semiconductor device employing a fabrication system 100G in accordance with another embodiment of the present disclosure. FIG. 12 illustrates an exemplary block diagram of the fabrication system 100G in accordance with another embodiment of the present disclosure.

With reference to FIGS. 11 and 12, at step S31, an implantation recipe may be executed on a current wafer by an implantation module 130 of the fabrication system 100G.

With reference to FIG. 12, in some embodiments, the first event E1 may be a wafer-in event to transfer the current wafer (also referred to as the first wafer W1) into the implantation module 130 which provides means for changing the current wafer from a first wafer state S1 to a second wafer state S2. In the present embodiment, the material process flow may include an implantation process for the current wafer. In some embodiments, the current wafer may be at the stage of front-end-of-line such as forming the word lines, forming the gate structure, forming the contact, but are not limited thereto. In some embodiments, the current wafer may be at the stage of back-end-of-line such as forming the plugs, or forming top metals, or forming the capacitors, but are not limited thereto.

It should be noted that, in the first event E1, multiple wafers may be likely to be processed grouped in lots, as such, the reference to a wafer in the singular in the present embodiment does not by necessity limit the disclosure to a single wafer, but may be illustrative of a lot including a plurality of wafers, a plurality of lots, or any such grouping of material.

In some embodiments, the implantation module 130 may include an implantation chamber that is not separately illustrated. The current wafer may be placed in the implantation chamber, and then may be subjected to the implantation process employing an implantation recipe. The implantation recipe for the current wafer may also be referred to as the first implantation recipe R1. In some embodiments, the first implantation recipe R1 may be a nominal recipe.

In some embodiments, the implantation module 130 may include a GUI component and a database similar to the GUI component and the database of the etch module 110 illustrated in FIG. 2, and descriptions thereof are not repeated herein.

With reference to FIG. 12, the artificial intelligence module 300 may be coupled to the implantation module 130. The communication between the implantation module 130 and the artificial intelligence module 300 may be similar to the communication between the etch module 110 and the artificial intelligence module 300 illustrated in FIG. 2, and descriptions thereof are not repeated herein. In some embodiments, the artificial intelligence module 300 may be integrated in the implantation module 130.

With reference to FIG. 12, after the implantation process of the implantation module 130 using the first implantation recipe R1, the wafer state of the current wafer may be turned into the second wafer state S2 (after the implantation process) from the first wafer state S1 (before the implantation process) by the implantation module 130.

With reference to FIGS. 11 and 12, at step S33, a set of data of the current wafer may be generated by a first measurement module 210.

With reference to FIG. 12, the current processed wafer may be transferred to the first measurement module 210 after the implantation process is completed. The first measurement module 210 may collect a set of data (also referred to as the first set of data D1) of the second wafer state S2 of the current processed wafer. In some embodiments, the first measurement module 210 may include a single measurement device or multiple measurement devices. The first measurement module 210 may include process module related measurement devices and/or external measurement devices. In the present embodiment, the first measurement module 210 may be a metrology tool for measuring electrical characteristics such as resistance or for measuring implanting profile.

In some embodiments, the first measurement module 210 may include a chip probe (CP) module 210-1 configured to measure electrical characteristics. For example, the CP module 210-1 may measure the leakage current, by resistance, of a gate, but is not limited thereto.

In some embodiments, the first measurement module 210 may include a wafer acceptance test module (WAT) module 210-3 configured to measure electrical characteristics. For example, the WAT module 210-3 may measure the current, by resistance, of a gate, or the leakage current, by resistance, of a drain of a transistor, but is not limited thereto.

In some embodiments, the first measurement module 210 may include a statistical process control (SPC) module 210-5 configured to provide data related to profile (or topography) of a layer. For example, the SPC module 210-5 may provide data related to profile (or topography) of a tungsten layer of a word line, or the profile (or topography) and/or thickness variation of a gate oxide layer, but is not limited thereto.

With reference to FIGS. 11 and 12, at step S35, the set of data of the current wafer may be analyzed by the artificial intelligence module 300 and the first implantation recipe may be updated by the artificial intelligence module when the set of data of the current wafer is not within a predetermined range.

With reference to FIG. 12, in some embodiments, the first set of data D1 of the current processed wafer collected by the first measurement module 210 after the implantation process may be analyzed by the artificial intelligence module 300 to determine that the data is within a predetermined range PR. If the data is not within the predetermined range PR, the first set of data D1 of the current processed wafer collected by the first measurement module 210 may be fed back to the artificial intelligence module 300 which coupled to the implantation module 130 (as shown in dashed arrow FB1). The artificial intelligence module 300 may update the first implantation recipe R1 according to the feedback data to provide a second implantation recipe R2 for the next wafer (as shown in dashed arrow UD1). The next wafer may be also referred to as the second wafer W2.

In some embodiments, the parameters PM, such as implanting dosage and/or implanting energy, of the first implantation recipe R1 may be updated to generate the second implantation recipe R2. In some embodiments, the tilt angle of the wafer of the first implantation recipe R1 may be updated according to the feedback data. In contrast, when the data is within the predetermined range PR, the first implantation recipe R1 may be kept and be applied to the next wafer. In other words, the implantation recipe R1 may be immediately updated or adjusted within a wafer-to-wafer time frame.

In some embodiments, the artificial intelligence module 300 may use the first set of data D1 of the current processed wafer collected by the first measurement module 210 after the deposition process to compute a set of process deviations. This computed set of process deviations may be determined based on the target data and the data of the current processed wafer collected by the first measurement module 210 after the deposition process. The set of process deviations may be used to determine a correction to the first deposition recipe for the next wafer to be processed.

In some embodiments, the artificial intelligence module 300 may use table-based and/or formula-based techniques. For example, the recipes may be in a table, and the artificial intelligence module 300 does a table lookup to determine which correction or corrections provide the best solutions. Alternately, the corrections may be determined using a set of formulas, and the artificial intelligence module 300 determines which correction formula or corrections formulas provide the best solutions.

When the artificial intelligence module 300 uses table-based techniques, the feedback control variables are configurable. For example, a variable can be a constant or coefficient in the table. In addition, there can be multiple tables, and rule-based switching can be accomplished based on an input range or an output range.

When the artificial intelligence module 300 uses formula-based control, the feedback control variables are configurable. For example, a variable can be a constant or coefficient in the formula. In addition, there can be multiple formula combinations, and rule-based switching can be accomplished based on an input range or an output range.

With reference to FIG. 12, the second event E2 may represent a following process for the current process wafer. In the present embodiment, the second event E2 may be a deposition process, or other applicable processes.

By employing the artificial intelligence module 300 coupled to the implantation module 130 and the first measurement module 210, the related process recipe (e.g., the implantation recipe in the present embodiment) may be updated (or adjusted) according to the data collected by the first measurement module 210. The next wafer may employ the updated (or adjusted) recipe so as to obtain parameters within acceptance criteria. As a result, the overall yield and/or reliability of the wafers may be improved.

In some embodiments, the first measurement module 210 may be integrated within the implantation module 130. In some embodiments, the first measurement module 210 may be a set of sensors which can monitor process-related parameters such as resistance, implanting profile, implanting concentration, or other applicable process-related parameters.

In some embodiments, the first measurement module 210 may provide feedback data to the artificial intelligence module 300 in a real time manner. Accordingly, the artificial intelligence module 300 may update the implantation recipe immediately. For example, the first implantation recipe R1 may be a multi-stage recipe such as a two-stage recipe. The first measurement module 210 may continuously monitor process-related parameters during the first stage of the first implantation recipe R1 and feed back to the artificial intelligence module 300 (as shown in dashed arrow FB1).

Meanwhile, the artificial intelligence module 300 may analyze the feedback data to determine whether to update the second stage of the first implantation recipe R1 or not. If the first stage of the first implantation recipe R1 includes a process deviation, the artificial intelligence module 300 can make correction and update (as shown in dashed arrow UD1) the second stage of the first implantation recipe R1 to make the processed wafer have parameters (e.g., thickness, resistance, and/or profile) within the acceptance criteria.

Accordingly, the first measurement module 210 may also continuously monitor process-related parameters during and after the second stage of the first implantation recipe R1 and feed back to the artificial intelligence module 300. Meanwhile, the artificial intelligence module 300 may analyze the feedback data to determine whether to update the first implantation recipe R1 for the next wafer to be processed.

In some embodiments, the artificial intelligence module 300 may be configured to monitor an initial implantation profile of the implantation recipe and automatically tune the implantation module 130/tilt angle of the wafer to provide the updated implantation recipe having a desired implantation profile taking into consideration the initial implantation profile and the desired implantation profile.

In some embodiments, the artificial intelligence module 300 may derive the initial implantation profile based on properties measured by a setup detector, a beam profiler and an incident angle detector of the implantation module 130.

Figure 13:
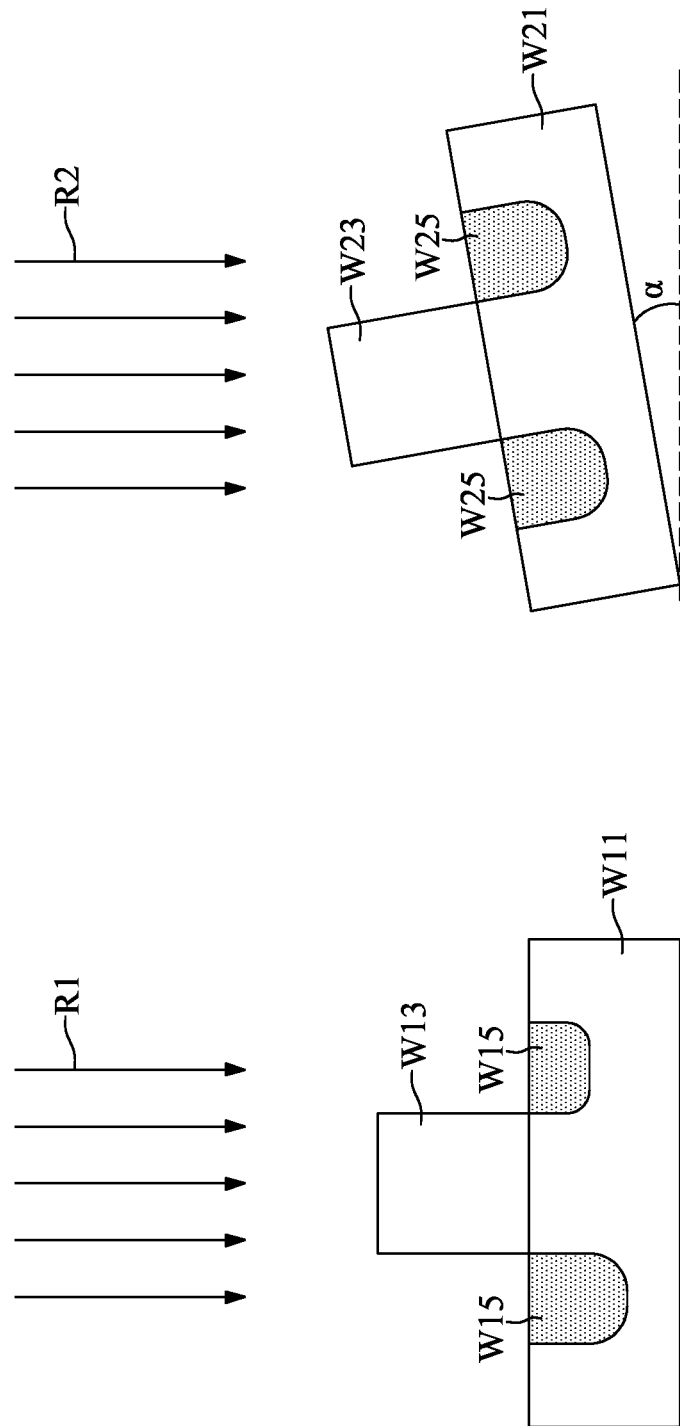
FIG. 13 illustrates, in a schematic cross-sectional view diagram, a first wafer processed by an implantation module using a first implantation recipe and a second wafer processed by the implantation module 130 using a second implantation recipe in accordance with another embodiment of the present disclosure.

FIG. 13 illustrates, in a schematic cross-sectional view diagram, the first wafer W1 processed by the implantation module 130 using the first implantation recipe R1 and the second wafer W2 processed by the implantation module 130 using the second implantation recipe R2 in accordance with another embodiment of the present disclosure.

With reference to FIG. 13, the first wafer W1 (i.e., the current wafer) may include the substrate W11 and the gate W13 disposed on the substrate W11. The implantation process employing the implantation module 130 using the first implantation recipe R1 may be performed on the first wafer W1 to form source/drain W15 in the substrate W11. The first wafer W1 including the source/drain W15 may be referred to as the processed current wafer. The related parameters, such as resistance, implanting concentration, and/or implanting profile of the source/drain W15 may be measured by the first measurement module 210 to generate the first set of data D1. The first set of data D1 may be analyzed by the artificial intelligence module 300 to determine whether to update the first deposition recipe R1. As shown in FIG. 13, the step coverage and/or profile may not be within the predetermined range (the implanting profile of the source/drain W15 is not symmetrical). Therefore, the artificial intelligence module 300 may update the parameters of the first implantation recipe R1 such as tilt angle, implanting dosage, and/or implanting energy of the first implantation recipe R1 to generate the second implantation recipe R2.

In contrast, the second wafer W2 (i.e., the next wafer) including the substrate W21 and the gate W23 disposed on the substrate W21 may be processed by the implantation module 130 using the second implantation recipe R2 having updated recipe parameters such as the tilt angle α. By employing the second implantation recipe R2, the related parameters (e.g., the implanting profile of the source/drain W25) of the second wafer may be within the predetermined range.

FIG. 114 illustrates an exemplary block diagram of a fabrication system 100H in accordance with another embodiment of the present disclosure.

Figure 14:
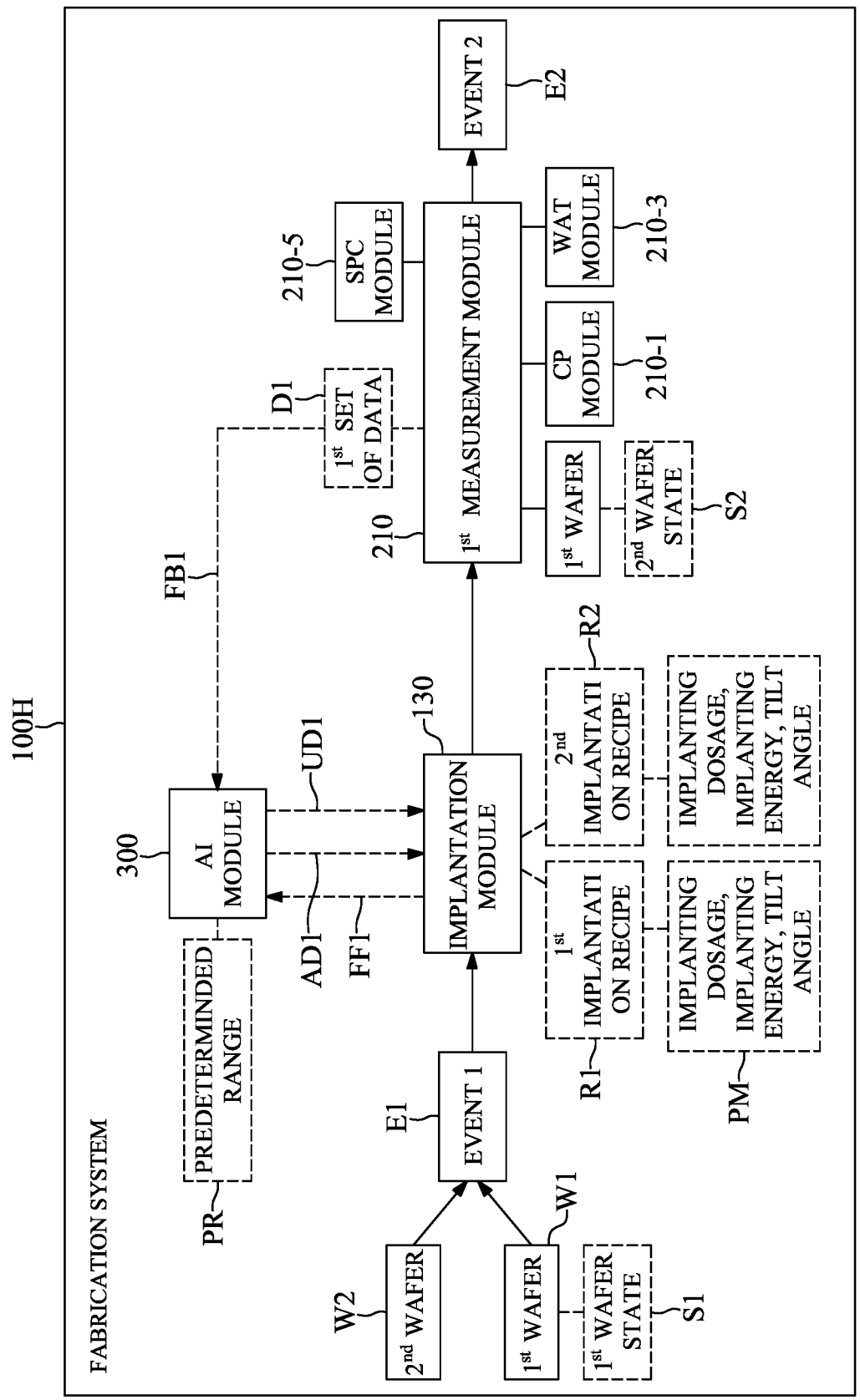
FIG. 14 illustrates an exemplary block diagram of a fabrication system in accordance with another embodiment of the present disclosure.

With reference to FIG. 14, the block diagram may illustrate the fabrication system 100H similar to that illustrated in FIG. 12. The same or similar elements in FIG. 14 as in FIG. 12 have been marked with similar reference numbers and duplicative descriptions have been omitted.

With reference to FIG. 14, before the implantation module 130 processes the current wafer of the first event E1, the trace data of the implantation module 130 such as module trace data, maintenance data, and/or other process-related data may be fed forward to the artificial intelligence module 300 (as shown in dashed arrow FF1). The artificial intelligence module 300 may analyze the trace data of the implantation module 130 to adjust the deposition recipe for processing the current wafer (as shown in dashed arrow AD1). After the process is completed, the artificial intelligence module 300 may also update the adjusted implantation recipe according to the feedback data of the first measurement module 210.

One aspect of the present disclosure provides a fabrication system including an etch module configured to execute a first etching recipe on a first wafer to turn a first wafer state of the first wafer to a second wafer state; a first measurement module configured to collect the second wafer state of the first wafer to generate a first set of data; and an artificial intelligence module coupled to the first measurement module and the etch module, configured to analyze the first set of data and update the first etching recipe to a second etching recipe when the first set of data is not within a predetermined range. The second etching recipe is configured to be applied on a second wafer to be processed after the first wafer.

Another aspect of the present disclosure provides a fabrication system including a deposition module configured to execute a first deposition recipe on a first wafer to turn a first wafer state of the first wafer to a second wafer state; a first measurement module configured to collect the second wafer state of the first wafer to generate a first set of data; and an artificial intelligence module coupled to the first measurement module and the deposition module, configured to analyze the first set of data and update the first deposition recipe to a second deposition recipe when the first set of data is not within a predetermined range. The second deposition recipe is configured to be applied on a second wafer to be processed after the first wafer.

Another aspect of the present disclosure provides a fabrication system including an implantation module configured to execute a first implantation recipe on a first wafer to turn a first wafer state of the first wafer to a second wafer state; a first measurement module configured to collect the second wafer state of the first wafer to generate a first set of data; and an artificial intelligence module coupled to the first measurement module and the etch module, configured to analyze the first set of data and update the first implantation recipe to a second implantation recipe when the first set of data is not within a predetermined range. The second implantation recipe is configured to be applied on a second wafer to be processed after the first wafer.

Due to the design of the fabrication system of the present disclosure, the related process recipe may be updated (or adjusted) on a wafer-to-wafer time frame by employing the artificial intelligence module 300 and the feedback data measured by the first measurement module 210. As a result, the yield and/or reliability of the wafers may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. An etching system for fabricating a semiconductor device structure, comprising:
    an etch module configured to execute a first etching recipe on a first wafer to turn a first wafer state of the first wafer to a second wafer state;
    a first measurement module configured to collect the second wafer state of the first wafer to generate a first set of data; and
    an artificial intelligence module coupled to the first measurement module and the etch module, configured to analyze the first set of data and update the first etching recipe to generate a second etching recipe when the first set of data is not within a predetermined range;
    wherein the second etching recipe is configured to be applied on a second wafer to be processed after the first wafer;
    wherein the artificial intelligence module is configured for generating the second etching recipe taking into consideration at least one of an etching rate of the second wafer, a rate of rotation of the second wafer, a tilt angle of the second wafer, an implanting recipe of the first wafer, and a deposition recipe of the first wafer.

2. The etching system of claim 1, wherein the artificial intelligence module is integrated in the etch module.

3. The etching system of claim 2, wherein the artificial intelligence module is configured to execute algorithms comprising one or more of the following, alone or in combination: machine learning, hidden Markov models; recurrent neural networks; convolutional neural networks; Bayesian symbolic methods; general adversarial networks; or support vector machines.

4. The etching system of claim 3, wherein the etch module is configured to feed forward at least one parameter of the etch module to the artificial intelligence module before executing the first etching recipe on the first wafer.

5. The etching system of claim 4, further comprising a second measurement module coupled to the artificial intelligence module and configured to collect the first wafer state of the first wafer to generate a second set of data.

6. The etching system of claim 5, wherein the second set of data is fed forward to the artificial intelligence module, and the second measurement module comprises an after-development-inspection metrology tool for measuring a critical dimension.

7. The etching system of claim 4, wherein the artificial intelligence module and the first measurement module communicate with each other using analog technologies, digital technologies, network technologies, Bluetooth technologies, or Near-field communication technologies.

8. The etching system of claim 4, wherein the first measurement module comprises a chip probe module configured to collect electrical characteristics of the second wafer state of the first wafer.

9. The etching system of claim 4, wherein the first measurement module comprises a wafer acceptance test module configured to collect electrical characteristics of the second state of the first wafer.

10. The etching system of claim 4, wherein the first measurement module comprises a statistical process control module configured to collect data related to a profile of the second wafer state of the first wafer.

11. The etching system of claim 4, wherein the artificial intelligence module is configured to receive at least one trace datum of the first wafer state of the first wafer.

12. The etching system of claim 1, wherein the artificial intelligence module is further configured for generating the second etching recipe taking into consideration a feature profile of the second wafer state of the first wafer.

* * * * *